(12) United States Patent
Lee et al.

(10) Patent No.: US 8,012,867 B2
(45) Date of Patent: Sep. 6, 2011

(54) WAFER LEVEL CHIP SCALE PACKAGE SYSTEM

(75) Inventors: Koo Hong Lee, Seoul (KR); Il Kwon Shim, Singapore (SG); Young Cheol Kim, Yongin-si (KR); Bongsuk Choi, Kyoungki-do (KR)

(73) Assignee: Stats Chippac Ltd, Singapore (SG)

( * ) Notice: Subject to any disclaimer, the term of this patent is extended or adjusted under 35 U.S.C. 154(b) by 393 days.

(21) Appl. No.: 11/618,647

(22) Filed: Dec. 29, 2006

(65) Prior Publication Data
US 2007/0178667 A1 Aug. 2, 2007

Related U.S. Application Data

(60) Provisional application No. 60/766,599, filed on Jan. 31, 2006.

(51) Int. Cl.
*H01L 21/44* (2006.01)

(52) U.S. Cl. ............ 438/617; 438/14; 438/15; 438/18; 438/106; 438/108; 257/E21.503; 257/E21.511; 257/685; 257/686; 257/778

(58) Field of Classification Search .......... 438/465
See application file for complete search history.

(56) References Cited

U.S. PATENT DOCUMENTS

| | | | |
|---|---|---|---|
| 5,815,000 A * | 9/1998 | Farnworth et al. | 324/755 |
| 5,904,497 A * | 5/1999 | Akram | 438/106 |
| 6,242,932 B1 * | 6/2001 | Hembree | 324/755 |
| 6,291,884 B1 * | 9/2001 | Glenn et al. | 257/747 |
| 6,340,846 B1 * | 1/2002 | LoBianco et al. | 257/783 |
| 6,400,007 B1 * | 6/2002 | Wu et al. | 257/686 |
| 6,429,528 B1 | 8/2002 | King et al. | |
| 6,476,474 B1 * | 11/2002 | Hung | 257/686 |
| 6,589,801 B1 | 7/2003 | Yoon et al. | |
| 6,607,937 B1 * | 8/2003 | Corisis | 438/108 |
| 6,632,881 B1 * | 10/2003 | Tsuchida et al. | 525/65 |
| 6,657,290 B2 * | 12/2003 | Fukui et al. | 257/686 |
| 6,690,089 B2 * | 2/2004 | Uchida | 257/686 |
| 6,707,140 B1 | 3/2004 | Nguyen et al. | |
| 6,791,168 B1 | 9/2004 | Connell et al. | |
| 6,798,049 B1 * | 9/2004 | Shin et al. | 257/678 |
| 6,853,064 B2 * | 2/2005 | Bolken et al. | 257/686 |
| 6,861,288 B2 * | 3/2005 | Shim et al. | 438/109 |
| 6,930,396 B2 * | 8/2005 | Kurita et al. | 257/777 |
| 6,946,323 B1 * | 9/2005 | Heo | 438/109 |
| 6,972,216 B2 * | 12/2005 | Huang et al. | 438/122 |
| 6,992,396 B2 * | 1/2006 | Arai et al. | 257/777 |
| 7,037,756 B1 * | 5/2006 | Jiang et al. | 438/109 |
| 7,042,070 B2 | 5/2006 | Yew et al. | |
| 7,101,731 B2 * | 9/2006 | Karnezos | 438/107 |
| 7,115,441 B2 | 10/2006 | Choi | |
| 7,119,427 B2 * | 10/2006 | Kim | 257/686 |
| 7,227,252 B2 * | 6/2007 | Bolken et al. | 257/686 |
| 7,294,530 B2 * | 11/2007 | Zhou | 438/107 |
| 7,298,045 B2 * | 11/2007 | Fujitani et al. | 257/724 |

(Continued)

*Primary Examiner* — N Drew Richards
*Assistant Examiner* — Ankush k Singal
(74) *Attorney, Agent, or Firm* — Mikio Ishimaru

(57) ABSTRACT

A wafer level chip scale package system is provided including placing a first integrated circuit over a semiconductor wafer having a second integrated circuit; connecting a second electrical interconnect between the first integrated circuit and the second integrated circuit; forming a stress relieving encapsulant on the outer perimeter of the second integrated circuit for covering the second electrical interconnect; and singulating a chip scale package, from the semiconductor wafer, through the stress relieving encapsulant and the semiconductor wafer.

20 Claims, 8 Drawing Sheets

U.S. PATENT DOCUMENTS

| | | | |
|---|---|---|---|
| 7,354,800 B2 * | 4/2008 | Carson | 438/109 |
| 7,372,141 B2 * | 5/2008 | Karnezos et al. | 257/686 |
| 7,394,148 B2 * | 7/2008 | Karnezos | 257/686 |
| 7,408,245 B2 * | 8/2008 | Hung et al. | 257/666 |
| 7,429,786 B2 * | 9/2008 | Karnezos et al. | 257/686 |
| 7,429,787 B2 * | 9/2008 | Karnezos et al. | 257/686 |
| 7,435,619 B2 * | 10/2008 | Shim et al. | 438/107 |
| 7,456,495 B2 * | 11/2008 | Pohl et al. | 257/686 |
| 7,645,634 B2 * | 1/2010 | Karnezos | 438/107 |
| 2003/0038374 A1 * | 2/2003 | Shim et al. | 257/777 |
| 2003/0045030 A1 * | 3/2003 | Hayashida et al. | 438/110 |
| 2003/0201526 A1 * | 10/2003 | Bolken et al. | 257/686 |
| 2004/0119153 A1 * | 6/2004 | Karnezos | 257/686 |
| 2004/0145039 A1 * | 7/2004 | Shim et al. | 257/678 |
| 2005/0133932 A1 * | 6/2005 | Pohl et al. | 257/777 |
| 2005/0224993 A1 * | 10/2005 | Manepalli et al. | 257/787 |
| 2006/0006518 A1 * | 1/2006 | Bolken et al. | 257/686 |
| 2006/0043556 A1 * | 3/2006 | Su et al. | 257/686 |
| 2006/0065958 A1 * | 3/2006 | Tsao et al. | 257/678 |
| 2006/0220206 A1 * | 10/2006 | Gerber et al. | 257/686 |
| 2006/0220210 A1 * | 10/2006 | Karnezos et al. | 257/686 |
| 2006/0244117 A1 * | 11/2006 | Karnezos et al. | 257/678 |
| 2007/0045835 A1 * | 3/2007 | Lin et al. | 257/734 |
| 2007/0194424 A1 * | 8/2007 | Camacho et al. | 257/686 |
| 2007/0228543 A1 * | 10/2007 | Walter et al. | 257/686 |
| 2007/0235216 A1 * | 10/2007 | Bae et al. | 174/260 |
| 2008/0179729 A1 * | 7/2008 | Shim et al. | 257/686 |

* cited by examiner

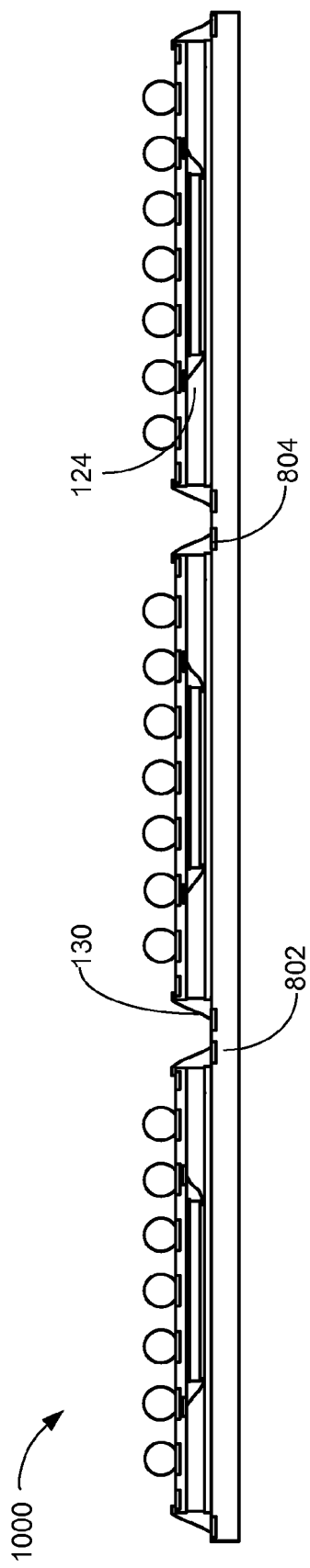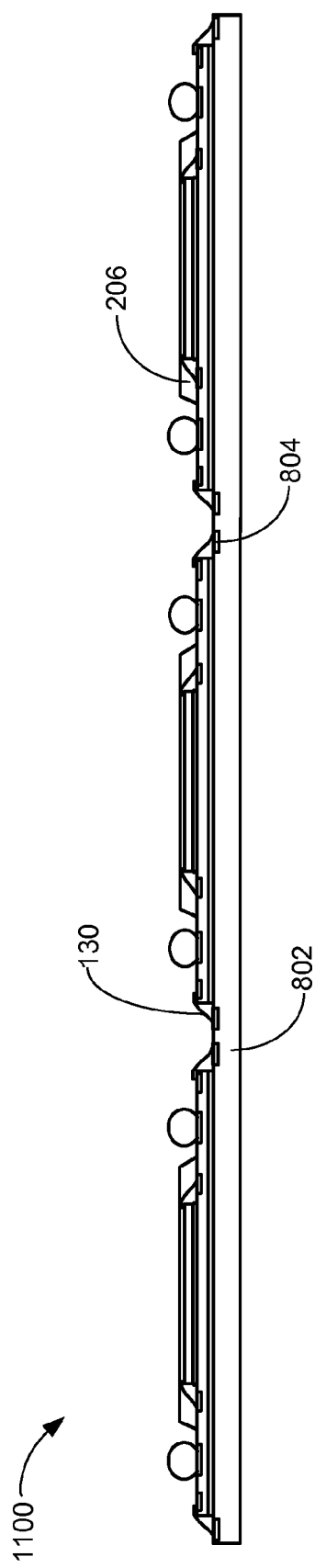

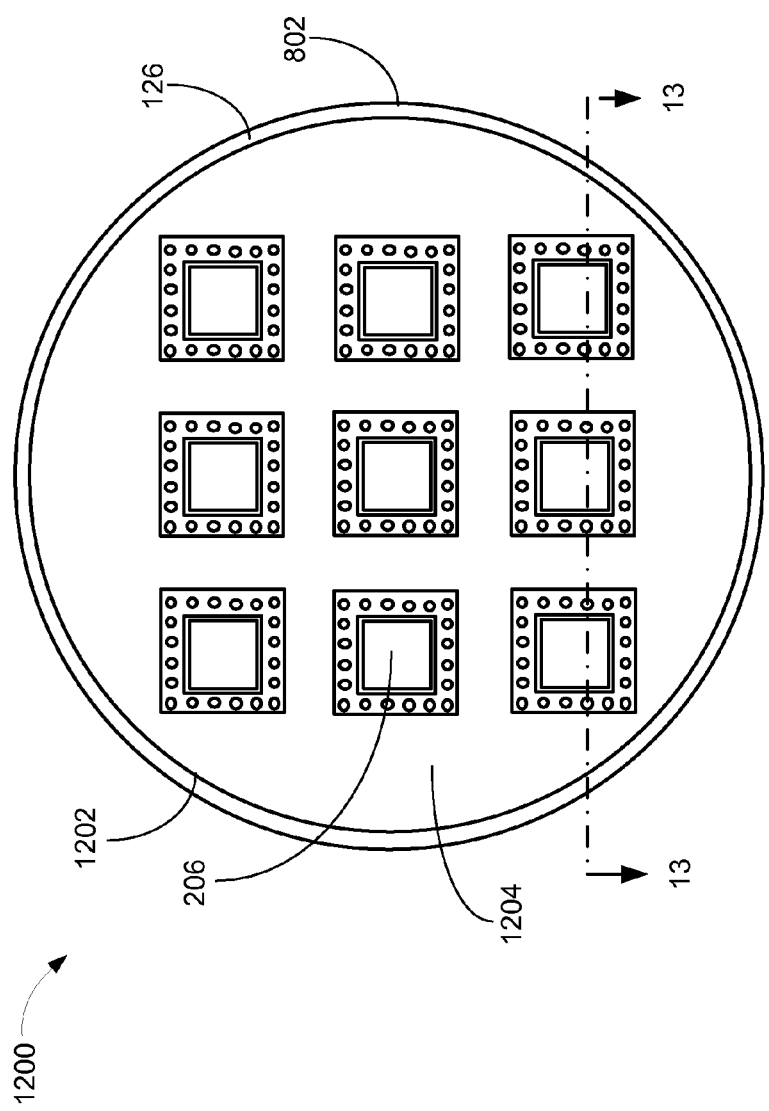
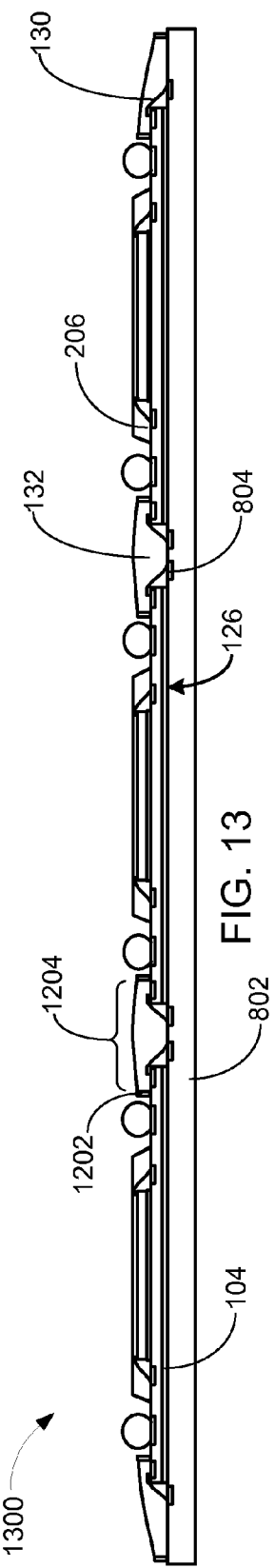
FIG. 12
FIG. 13

WAFER LEVEL CHIP SCALE PACKAGE SYSTEM

CROSS-REFERENCE TO RELATED APPLICATION

This application claims the benefit of U.S. Provisional Patent Application Ser. No. 60/766,599 filed Jan. 31, 2006.

TECHNICAL FIELD

The present invention relates generally to integrated circuit packaging, and more particularly to a system for wafer level manufacturing of stackable integrated circuit packages.

BACKGROUND ART

Today the drive for miniaturization is exemplified by the cellular telephone industry. A few years ago large phones that allowed you to stay in touch were widely accepted. Today a cellular telephone must fit easily in the palm of your hand, even for a small woman or a child. The phone is also not for just keeping in touch. It has wireless internet access, a camera with video recording, embedded games and the ability to store the number for every person that you have ever dialed accompanied by their picture. In order to achieve this level of function packed into a very small space, package technology has made dramatic changes to enable the innovation.

Chip-on-board and board-on-chip (BOC) techniques are used to attach semiconductor dies to an interposer or other carrier substrate such as a printed circuit board (PCB). Attachment can be achieved through flip chip attachment, wire bonding, or tape automated bonding ("TAB"). Flip chip attachment typically utilizes ball grid array (BGA) technology. The BGA component (die) includes conductive external contacts, typically in the form of solder balls or bumps, arranged in a grid pattern on the active surface of the die, which permit the die to be flip chip mounted to an interposer or other carrier substrate (e.g., PCB).

In a flip chip attachment, the balls of the BGA component are aligned with terminals on the carrier substrate, and connected by reflowing the solder balls. The solder balls can be replaced with a conductive polymer that is cured. A dielectric under-fill is then interjected between the flip chip die and the surface of the carrier substance to embed the solder balls and mechanically couple the BGA component to the carrier substrate.

Wire bonding and TAB attachment generally involve attaching a die by its backside to the surface of a carrier substrate with an appropriate adhesive (e.g., epoxy) or tape. With wire bonding, bond wires are attached to each bond pad on the die and bonded to a corresponding terminal pad on the carrier substrate (e.g., interposer). With TAB, ends of metal leads carried on a flexible insulating tape such as a polyimide, are attached to the bond pads on the die and to the terminal pads on the carrier substrate. A dielectric (e.g., silicon or epoxy) is generally used to cover the bond wires or metal tape leads to prevent damage.

High performance, low cost, increased miniaturization of components, and greater packaging density of integrated circuits have long been goals of the computer industry. One method of increasing integrated circuit density while reducing package size and height is to stack dies vertically. Different approaches to packaging have been pursued to provide stacked die devices.

One such example of a stacked die to lower wire bond loop height is to mount a flip chip die on a chip-on-board ("FC-on-chip"). The package includes a flip chip die mounted via solder bumps with the active surface facing down onto the active surface of a bottom die (chip-on-board), which in turn, is mounted with an adhesive tape or paste onto an interposer substrate. Bonding wires connect the bond pads on the bottom die to lead or trace ends on the interposer. The interposer could include solder balls for mounting the encapsulated package (component) onto a substrate, e.g., motherboard or PCB.

Flip chip attachment has provided improved electrical performance and allowed greater packaging density. However, developments in ball grid array technology have produced arrays in which the balls are made smaller and with tighter pitch. As the balls become smaller and are set closer together, it poses problems for the mutual alignment of the conductive bumps on the flip chip die with the bond pads on the bottom die, requiring a metal reroute or redistribution layer (RDL) disposed as an intermediate layer on the surface of the bottom die. The RDL effects an electrical interconnection (redistribution) between the bond pads on the flip chip die to the bond pads on the bottom die for die attachment and wire bonding to the substrate.

Fabricating an FC-on-chip can also lead to high costs and process difficulties. For Example, a flip chip mounting device is required to accurately align the top die to the bottom die. Another drawback is that damage can occur to the active surface of the bottom die during an under-filling process onto the active surface, and a molding filler can fail to flow into voids between the dies if the gap is too small.

Thus, a need still remains for a wafer level chip scale package. In view of the enormous demand for smaller and more intelligent electronic devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have long been sought but prior developments have not taught or suggested any solutions and, thus, solutions to these problems have long eluded those skilled in the art.

DISCLOSURE OF THE INVENTION

The present invention provides a wafer level chip scale package system including placing a first integrated circuit over a semiconductor wafer having a second integrated circuit; connecting a second electrical interconnect between the first integrated circuit and the second integrated circuit; forming a stress relieving encapsulant on the outer perimeter of the second integrated circuit for covering the second electrical interconnect; and singulating a chip scale package, from the semiconductor wafer, through the stress relieving encapsulant and the semiconductor wafer.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 10 is a cross-sectional view of the base package of FIG. 1 in a wire bonding phase of manufacturing;

FIG. 11 is a cross-sectional view of the base package of FIG. 2 in a wire bonding phase of manufacturing;

FIG. 12 is a top view of the wafer level chip scale package system of FIG. 2 in a package molding phase of manufacturing;

FIG. 13 is a cross-sectional view of the wafer level chip scale package system of FIG. 12 along the section line 13-13;

BEST MODE FOR CARRYING OUT THE INVENTION

Figure 1:
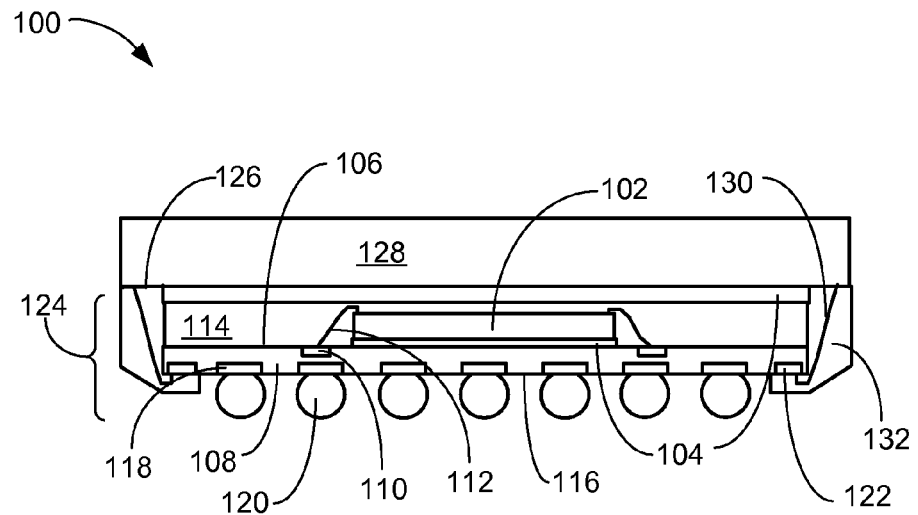
FIG. 1 is a cross-sectional view of a wafer level chip scale package system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the semiconductor wafer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, sawing, and/or removal of the material or laser trimming as required in forming a described structure.

Referring now to FIG. 1, therein is shown a cross-sectional view of a wafer level chip scale package system 100, in an embodiment of the present invention. The cross-sectional view of the wafer level chip scale package system 100 depicts a first integrated circuit 102 with an adhesive 104, such as a die attach material, attached to a component side 106 of a package substrate 108. A first wire bond pad 110, on the component side 106 of the package substrate 108, is coupled to the first integrated circuit 102 by a first electrical interconnect 112, such as a bond wire. A molded cap 114, such as an epoxy molding compound, encapsulates the first integrated circuit 102, the first electrical interconnect 112 and the component side 106 of the package substrate 108. A system side 116 of the package substrate 108 has a contact pad 118 for electrical connection of a system interconnect 120, such as a solder ball, solder column, or stud bump. A second wire bond pad 122 is formed on the system side 116 of the package substrate 108 for further connection. The combination forms a base package 124.

The base package 124 is adhesively bonded, in an inverted position, directly to an active surface 126 of a second integrated circuit 128 by the adhesive 104. The base package 124 may be positioned on the active surface 126 of the second integrated circuit 128 by a pick and place machine (not shown). The position of the base package 124 is controlled in order to keep all of the connection paths as short as possible. A second electrical interconnect 130, such as a bond wire, electrically connects the second integrated circuit 128 to the second wire bond pad 122 on the system side 116 of the package substrate 108. A stress relieving encapsulant 132, such as an under-fill material, encloses the second wire bond pad 122, the second electrical interconnect 130, and the active surface 126 of the second integrated circuit 128.

It has been discovered that the wafer level chip scale package system 100 may provide a better overall yield than other processes because the base package can be completely tested prior to assembly on the wafer tested die. The subsequent assembly and singulation processes are well known and in high volume production.

Figure 2:
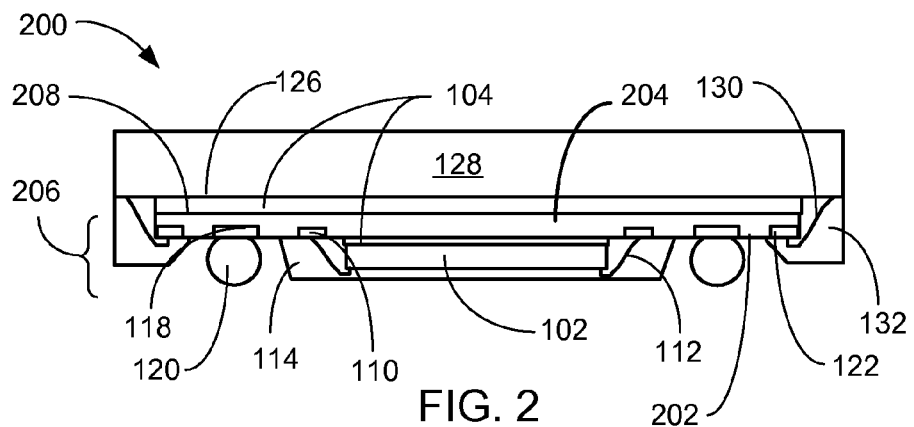
FIG. 2 is a cross-sectional view of the wafer level chip scale package system in an alternative embodiment of the present invention.

Referring now to FIG. 2, therein is shown a cross-sectional view of a wafer level chip scale package system 200 in an alternative embodiment of the present invention. The cross-sectional view of the wafer level chip scale package system 200 depicts the first integrated circuit 102 with the adhesive 104, such as a die attach material, attached to a system side 202 of a package substrate 204. The first wire bond pad 110, on the system side 202 of the package substrate 204, is coupled to the first integrated circuit 102 by the first electrical interconnect 112, such as a bond wire. The molded cap 114, such as an epoxy molding compound, encapsulates the first integrated circuit 102, the first electrical interconnect 112 and a portion of the system side 202 of the package substrate 204. The contact pad 118 is positioned between the molded cap 114 and the second wire bond pad 122. The system interconnect 120 is coupled to the contact pad 118 forming a base package 206. The adhesive 104, such as a die attach material, is attached to a backside 208 of the package substrate 204.

The base package 206 is mounted on the active surface 126 of the second integrated circuit 128. The second electrical interconnect 130 may be coupled between the active surface 126 of the second integrated circuit 128 and the second wire bond pad 122 forming an electrical connection between the second integrated circuit 128, the first integrated circuit 102, the system interconnect 128, or a combination thereof. The stress relieving encapsulant 132, such as an under-fill material, protects the second electrical interconnect 130 and the active surface 126 of the second integrated circuit 128.

Figure 3:
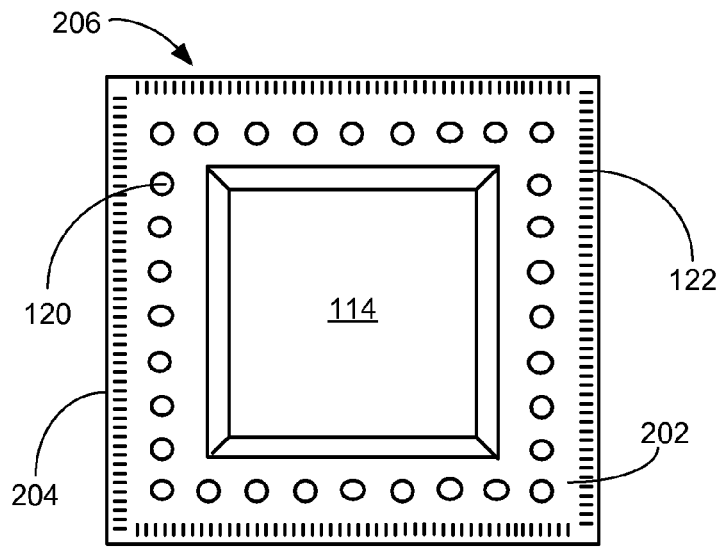
FIG. 3 is a system side view of a base package as shown in FIG. 2.

Referring now to FIG. 3, therein is shown the system side 202 view of the base package 206 as shown in FIG. 2. The system side 202 view of the base package 206 depicts the package substrate 204 having the molded cap 114 positioned in the center of the system side 202. A row of the second wire bond pad 122 extends around the periphery of the package substrate 204. A single row of the system interconnect 120 is positioned between the molded cap 114 and the row of the second wire bond pad 122.

This geometry is an example only and it is understood that the geometry of the base package 206 may differ. A smaller version of the molded cap 114 would allow room for a double row of the system interconnects, as an example. The number and position of the rows of the second wire bond pad 122 is also for the example, as any number of the second wire bond pad 122 that meet the physical design limitations of the package substrate 204 technology would be possible. The pitch and position of the system interconnect 120 are also limited only by the tolerances of the assembly.

Figure 4:
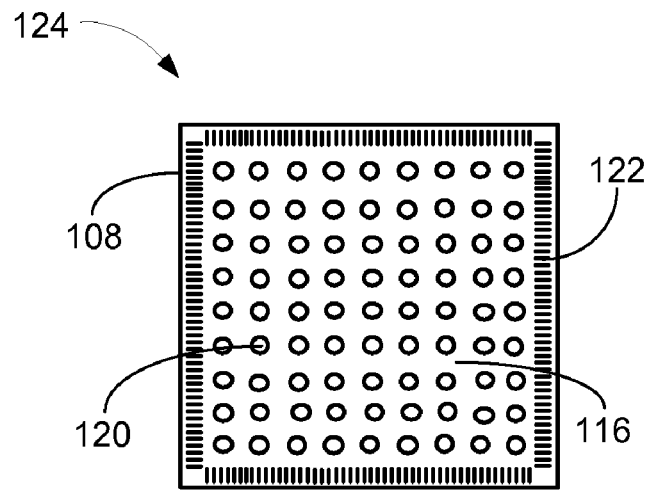
FIG. 4 is a bottom view of the base package as shown in FIG. 1.

Referring now to FIG. 4, therein is shown a bottom view of the base package 124 as shown in FIG. 1. The bottom view of the base package 124 depicts the package substrate 108 having the system side 116 with an array of the system interconnect 120. A row of the second wire bond pad 122 extends around the periphery of the package substrate 108. The number and spacing of the system interconnect 120 and the second wire bond pad 122 is by way of example only and no limitation is implied by the drawing.

Figure 5:
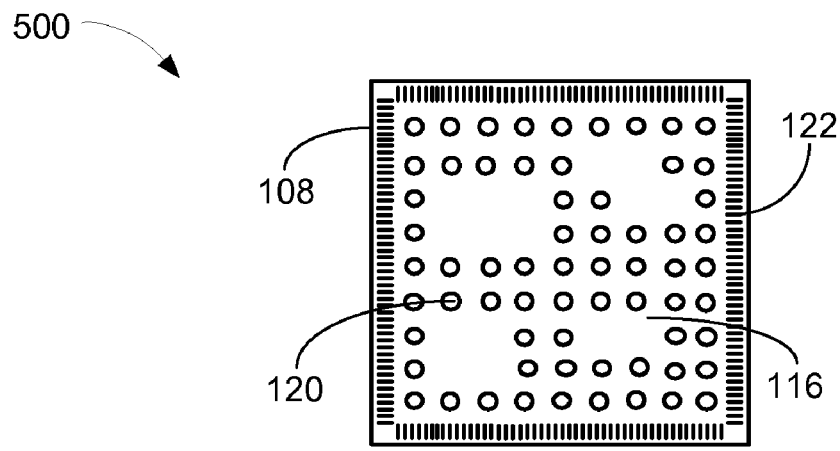
FIG. 5 is a bottom view of a base package as shown in FIG. 1 with an alternative ball pattern.

Referring now to FIG. 5, therein is shown a bottom view of a base package 500 as shown in FIG. 1 with an alternative ball pattern. The bottom view of the base package 500 depicts the package substrate 108 having the system side 116 with an array of the system interconnect 120. A row of the second wire bond pad 122 extends around the periphery of the package substrate 108. The number and spacing of the system interconnect 120 and the second wire bond pad 122 is by way of example only and no limitation is implied by the drawing. The areas that are missing the system interconnect 120 may be for allowing a clearance around some structure on the printed circuit board (not shown) or a low profile discrete component that is placed on the printed circuit board (not shown).

Figure 6:
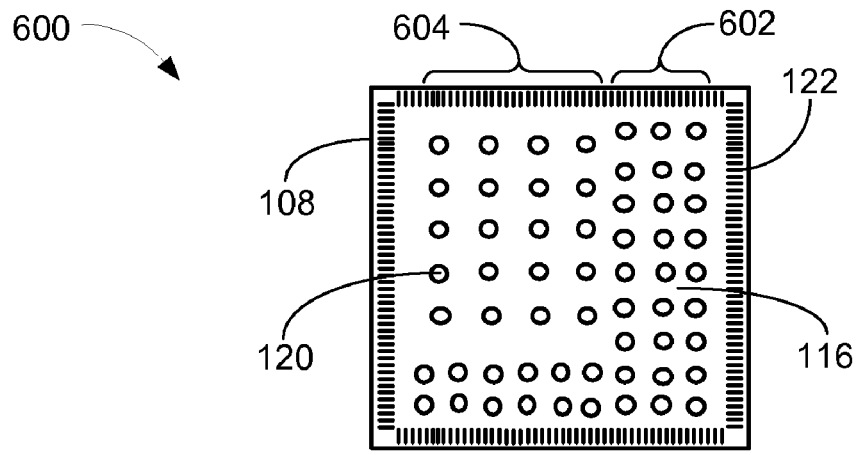
FIG. 6 is a bottom view of a base package as shown in FIG. 1 with another alternative ball pattern.

Referring now to FIG. 6, therein is shown a bottom view of a base package 600 as shown in FIG. 1 with another alternative ball pattern. The bottom view of the base package 600 depicts the package substrate 108 having the system side 116 with an array of the system interconnect 120. A row of the second wire bond pad 122 extends around the periphery of the package substrate 108. The number and spacing of the system interconnect 120 and the second wire bond pad 122 are by way of example only and no limitation is implied by the drawing.

A first pattern 602 of the system interconnect 120 may have a higher density of the system interconnect 120 than a second pattern 604. The first pattern 602 and the second pattern 604 may be of any size, pitch, and configuration. In this example the first pattern 602 may be used to voltages or low frequency signals, while the second pattern 604 may be used for higher frequency signals that might create a cross-talk problem if they were in a closer proximity to each other.

Figure 7:
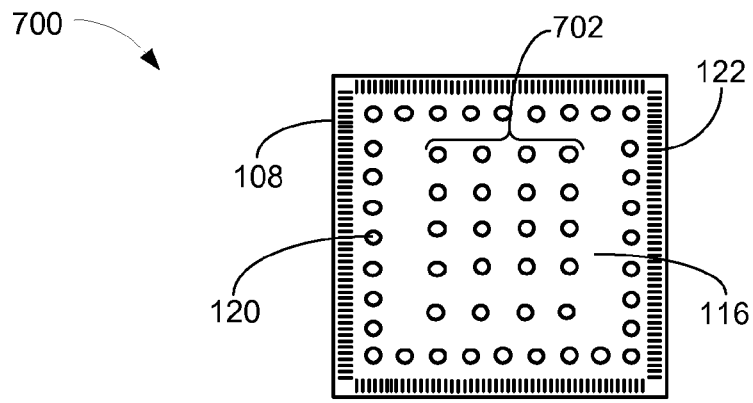
FIG. 7 is a bottom view of the base package as shown in FIG. 1 with yet another alternative ball pattern.

Referring now to FIG. 7, therein is shown a bottom view of a base package 700 as shown in FIG. 1 with yet another alternative ball pattern. The bottom view of the base package 700 depicts the package substrate 108 having the system side 116 with an array of the system interconnect 120. A row of the second wire bond pad 122 extends around the periphery of the package substrate 108. The number and spacing of the system interconnect 120 and the second wire bond pad 122 is by way of example only and no limitation is implied by the drawing.

A core pattern 702 of the system interconnect 120 may be used for connecting the first integrated circuit 102 of FIG. 1 to a printed circuit board (not shown). The outer ring of the system interconnect 120 may be used for connecting the second integrated circuit 128 of FIG. 1 which is not yet coupled to the base package 700. The number and position of the system interconnect 120 may be changed to meet the requirements of the application.

Figure 8:
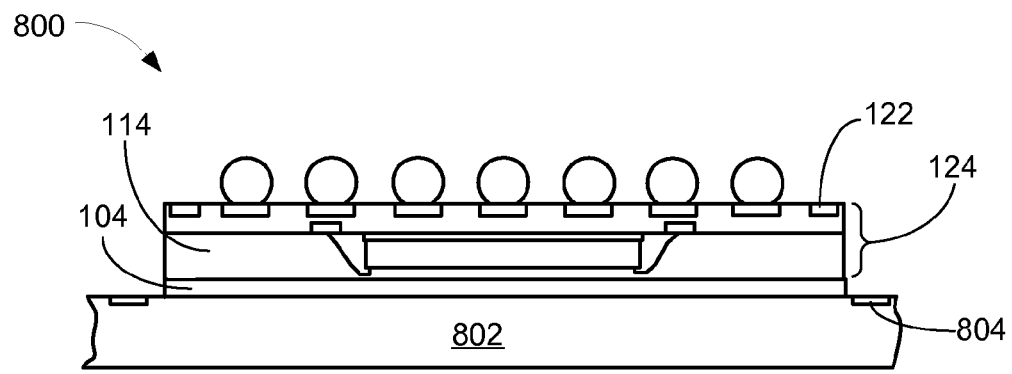
FIG. 8 is a cross-sectional view of the base package of FIG. 1 in a wafer mount phase of manufacturing.

Referring now to FIG. 8, therein is shown a cross-sectional view of the base package 124 in a wafer mount phase of manufacturing. The cross-sectional view of the base package 124 depicts a semiconductor wafer 802, having a wafer bond pad 804 coupled to the second integrated circuit 128 of FIG. 1 formed thereon. The adhesive 104, such as a die attach material, placed over the second integrated circuit is attached to the molded cap 114 of the base package 124.

The base package 124 and the adhesive 104 are precisely placed to allow a wire bonding machine (not shown) to have access to the wafer bond pad 804 and the second wire bond pad 122. The placement of the base package 124 and the adhesive may be performed by a robotic device (not shown).

Figure 9:
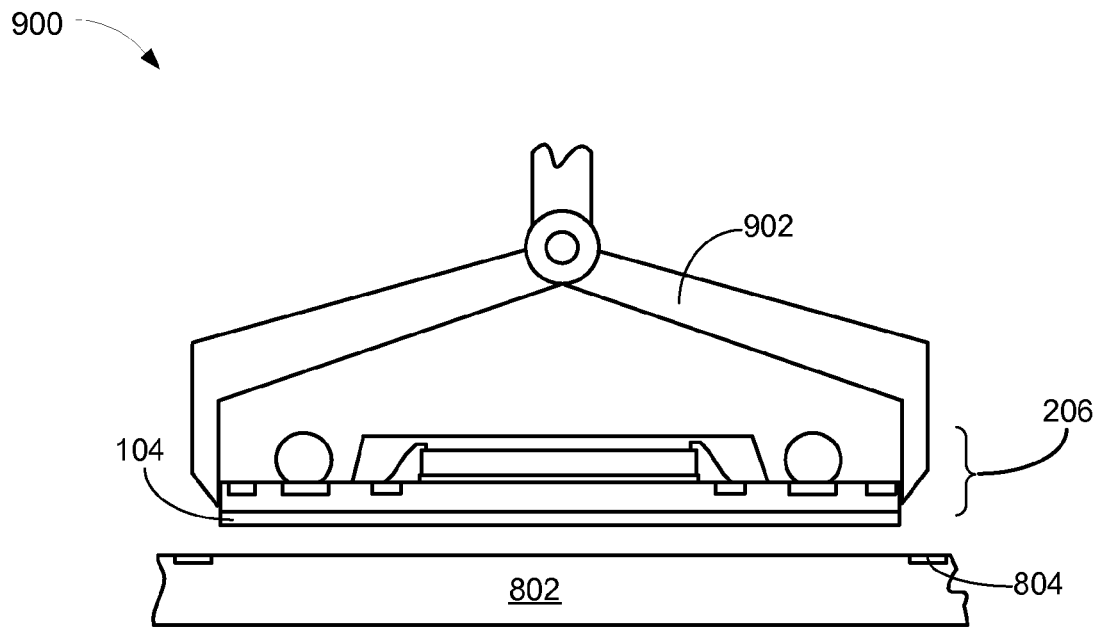
FIG. 9 is a cross-sectional view of the base package of FIG. 2 in a wafer mount phase of manufacturing.

Referring now to FIG. 9, therein is shown a cross-sectional view of the base package 206 in a wafer mount phase of manufacturing. The cross-sectional view of the base package 206 depicts a pick and place machine 902 positioning the base package 206 with the adhesive 104 attached. The pick and place machine 902 is normally used to position integrated circuit packages (not shown) on a printed circuit board (not shown). The pick and place machine 902 may be optically aligned and capable of very fine position adjustments in a volume manufacturing environment.

The base package 206 and the adhesive may be precisely positioned and attached to the semiconductor wafer 802, such that the base package 206 is centered between the wafer bond pad 804 formed on each side of the second integrated circuit 128 of FIG. 1. Each of the tested locations on the semiconductor wafer 802 may have the base package 206 and the adhesive 104 applied during the operation. In this way potentially the semiconductor wafer 802 may be entirely covered with the base package 206 and the adhesive 104 in preparation for the next phase of manufacturing.

Referring now to FIG. 10, therein is shown a cross-sectional view of the base package 124 of FIG. 1 in a wire bonding phase of manufacturing. The cross-sectional view of the base package 124 depicts the semiconductor wafer 802 having the base package 124 adhered to locations across the semiconductor wafer 802. The second electrical interconnect 130, such as a bond wire, is applied to the wafer bond pad 804 and the second wire bond pad 122. The operation completes the coupling between the second integrated circuit 128, of FIG. 1 having the wafer bond pad 804 and the base package 124 having the second wire bond pad 122.

Referring now to FIG. 11, therein is shown a cross-sectional view of the base package 206 of FIG. 2 in a wire bonding phase of manufacturing. The cross-sectional view of the base package 206 depicts the semiconductor wafer 802 having the base package 206 adhered to locations across the semiconductor wafer 802. The second electrical interconnect 130, such as a bond wire, is applied to the wafer bond pad 804 and the second wire bond pad 122. The operation completes the coupling between the second integrated circuit 128, of FIG. 1 having the wafer bond pad 804 and the base package 206 having the second wire bond pad 122.

Referring now to FIG. 12, therein is shown a top view of the wafer level chip scale package system 200 of FIG. 2 in a package molding phase of manufacturing. The top view of the wafer level chip scale package system 200 depicts the semiconductor wafer 802 having the base package 206 mounted over the active surface 126 of the semiconductor wafer 802.

A dam material 1202 is formed around the edge of the semiconductor wafer and over the edge of the base package 206. The dam material forms a reservoir 1204 that may be filled with the stress relieving encapsulant 132. The stress relieving encapsulant is poured over the active surface 126 of the semiconductor wafer 802 and the electrical interconnects 130 of FIG. 1. A section-line 13-13 depicts the view for FIG. 13.

Referring now to FIG. 13, therein is shown a cross-sectional view of the wafer level chip scale package system 200 of FIG. 12 along the section line 13-13. The cross-sectional view of the wafer level chip scale package system 200 depicts the semiconductor wafer 802 having the wafer bond pad 804 the base package 206 is mounted over the semiconductor wafer 802 on the adhesive 104. The dam material 1202 forms the reservoir 1204 for the stress relieving encapsulant 132. The stress relieving encapsulant 132, such as an under-fill material, is formed on the second electrical interconnect 130 and the active surface 126 of the semiconductor wafer 802. The stress relieving encapsulant 132 protects the second electrical interconnect 130.

Figure 14:
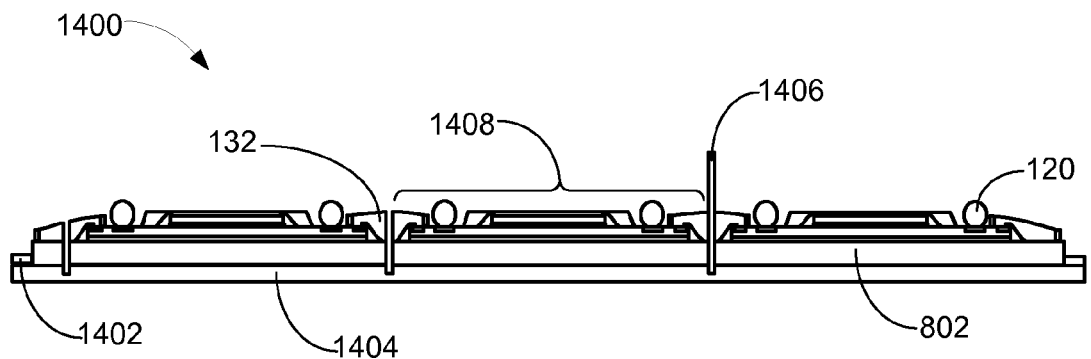
FIG. 14 is a cross-sectional view of the wafer level chip scale package system of FIG. 12 in a singulation phase of manufacturing.

Referring now to FIG. 14, therein is shown a cross-sectional view of the wafer level chip scale package system 200 of FIG. 12 in a singulation phase of manufacturing. The cross-sectional view of the wafer level chip scale package system 200 depicts the semiconductor wafer 802 mounted in a dicing frame 1402 and held by a dicing tape 1404. A singulation saw 1406 may be used to singulate a chip scale package 1408. The singulation saw 1406 is used to cleave the section of the semiconductor wafer 802 covered by the stress relieving encapsulant 132. When the dicing tape 1404 is released the chip scale package 1408 is realized. The system interconnect 120 allows electrical connection to the next level system, such as a printed circuit board. The use of the singulation saw 1406 and dicing tape 1404 is for example and it is understood that the singulation process may include other singulation tools, such as a laser scribe or a diamond edge scribe.

Figure 15:
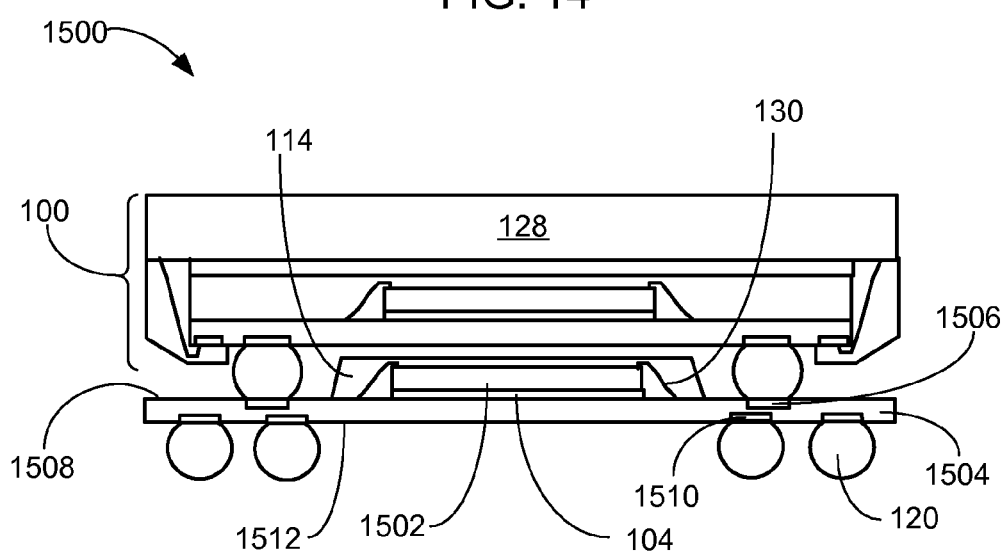
FIG. 15 is a cross-sectional view of the wafer level chip scale package system in a package on package structure with a wire bond BGA package.

Referring now to FIG. 15, therein is shown a cross-sectional view of the wafer level chip scale package system 100 in a package on package structure 1500 with a wire bond BGA package. The cross-sectional view of the wafer level chip scale package system 100 in the package on package structure 1500 depicts a third integrated circuit 1502, such as a wire bond integrated circuit, on a layer of the adhesive 104 that is on a stacking substrate 1504. The stacking substrate 1504 has a stacking contact 1506 on a component side 1508 and a system contact 1510 on a system side 1512. The third integrated circuit 1502 is coupled to the stacking substrate 1504 by the second electrical interconnect 130, such as a bond wire.

The molded cap 114, such as an epoxy molding compound molded into a cap, is on the third integrated circuit 1502, the second electrical interconnect 130, and a portion of the component side 1508 of the stacking substrate 1504. The system interconnect 120 is coupled to the system contact 1510 on the system side 1512 of the stacking substrate 1504. The wafer level chip scale package system 100 is coupled to the stacking contact 1506 completing the structure.

The package on package structure 1500 can very efficiently couple three or more of the integrated circuits in a space the size of the second integrated circuit 128. This configuration is an example only and it is understood that the stacking substrate 1504 may support more than the third integrated circuit 1502.

Figure 16:
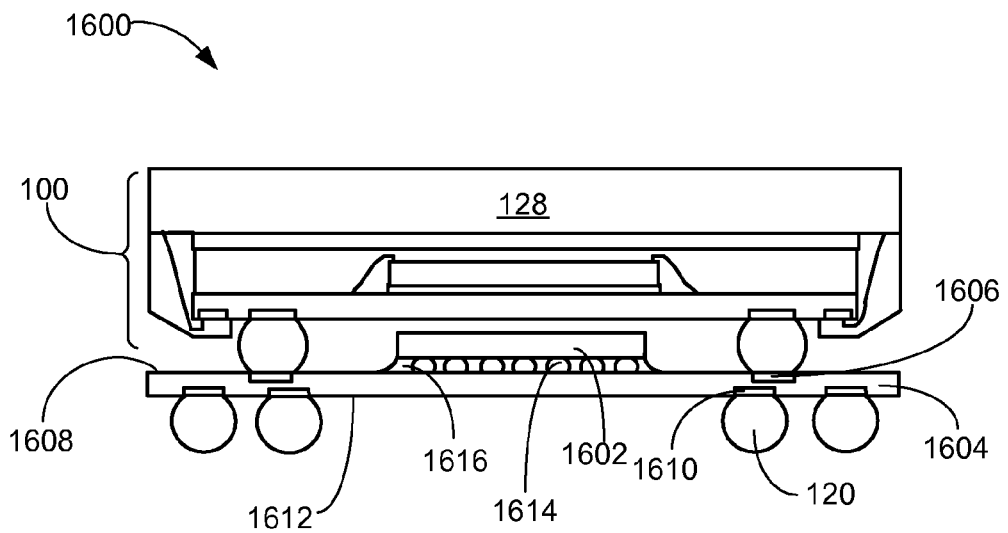
FIG. 16 is a cross-sectional view of the wafer level chip scale package system in a package on package structure with a flip chip BGA package.

Referring now to FIG. 16, therein is shown a cross-sectional view of the wafer level chip scale package system 100 in a package on package structure 1600 with a flip chip BGA package. The cross-sectional view of the wafer level chip scale package system 100 in the package on package structure 1600 depicts a third integrated circuit 1602, such as a flip chip integrated circuit, on a stacking substrate 1604. The stacking substrate 1604 has a stacking contact 1606 on a component side 1608 and a system contact 1610 on a system side 1612.

The third integrated circuit 1602 is coupled to the stacking substrate 1604 by an interconnect 1614, such as a solder ball, solder column, or stud bump. An adhesive material 1616, such as an under-fill material, is used to protect the interconnect 1614. The system interconnect 120 is coupled to the system contact 1610 on the system side 1612 of the stacking substrate 1604. The wafer level chip scale package system 100 is coupled to the stacking contact 1606 completing the structure.

The package on package structure 1600 can very efficiently couple three or more of the integrated circuits in a space the size of the second integrated circuit 128. This configuration is an example only and it is understood that the stacking substrate 1604 may support more than the third integrated circuit 1602.

Figure 17:
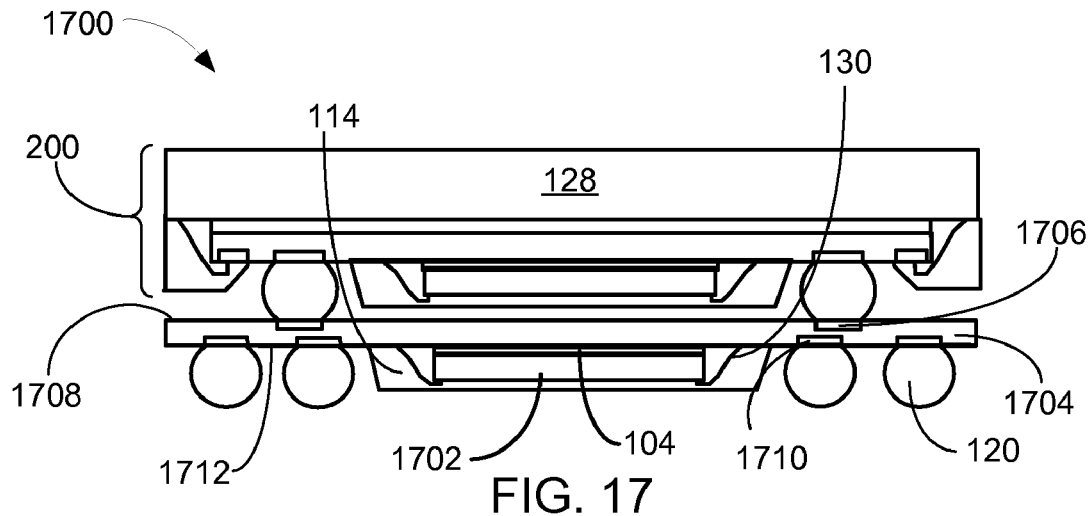
FIG. 17 is a cross-sectional view of the wafer level chip scale package system in a package on package structure with an inverted wire bond BGA package.

Referring now to FIG. 17, therein is shown a cross-sectional view of the wafer level chip scale package system 200 in a package on package structure 1700 with an inverted wire bond BGA package. The a cross-sectional view of the wafer level chip scale package system 200 in the package on package structure 1700 depicts a third integrated circuit 1702, such as a wire bond integrated circuit, on a layer of the adhesive 104 that is on a stacking substrate 1704. The stacking substrate 1704 has a stacking contact 1706 on a top side 1708 and a system contact 1710 on a system side 1712. The third integrated circuit 1702 is coupled to the system side 1712 of the stacking substrate 1704 by the second electrical interconnect 130, such as a bond wire.

The molded cap 114, such as an epoxy molding compound molded into a cap, is on the third integrated circuit 1702, the second electrical interconnect 130, and a portion of the system side 1712 of the stacking substrate 1704. The system interconnect 120 is coupled to the system contact 1710 on the system side 1712 of the stacking substrate 1704. The wafer level chip scale package system 200 is coupled to the stacking contact 1706 completing the structure.

The package on package structure 1700 can very efficiently couple three or more of the integrated circuits in a space the size of the second integrated circuit 128. This configuration is an example only and it is understood that the stacking substrate 1704 may support more than the third integrated circuit 1702.

Figure 18:
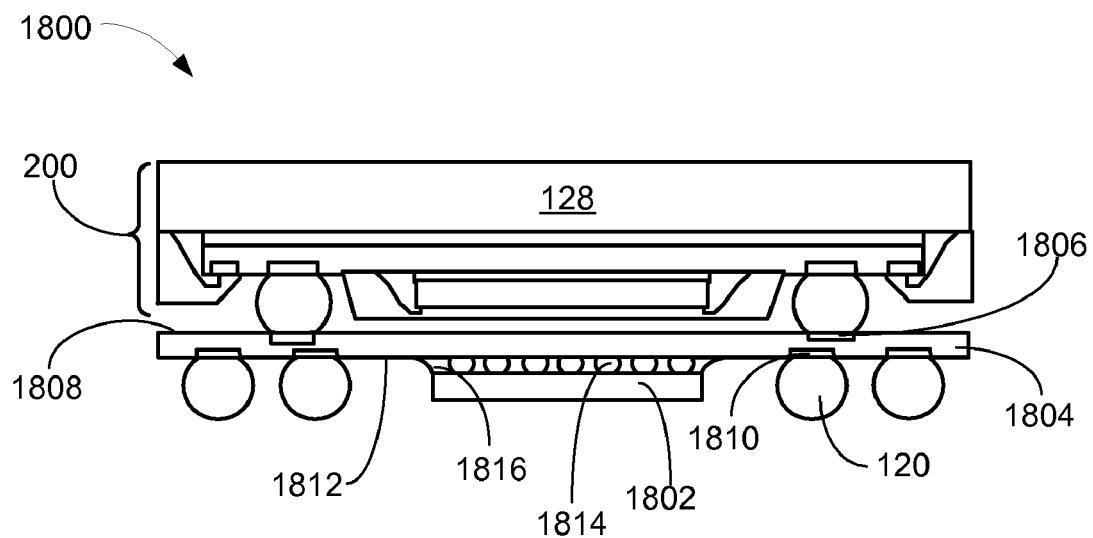
FIG. 18 is a cross-sectional view of the wafer level chip scale package system in a package on package structure with an inverted flip chip BGA package.

Referring now to FIG. 18, therein is shown a cross-sectional view of the wafer level chip scale package system 200 in a package on package structure 1800 with an inverted flip chip BGA package. The cross-sectional view of the wafer level chip scale package system 200 in the package on package structure 1800 depicts a third integrated circuit 1802, such as a flip chip integrated circuit, on a stacking substrate 1804. The stacking substrate 1804 has a stacking contact 1806 on a component side 1808 and a system contact 1810 on a system side 1812.

The third integrated circuit 1802 is coupled to the system side 1812 of the stacking substrate 1804 by an interconnect 1814, such as a solder ball, solder column, or stud bump. An adhesive material 1816, such as an under-fill material, is used to protect the interconnect 1814. The system interconnect 120 is coupled to the system contact 1810 on the system side 1812 of the stacking substrate 1804. The wafer level chip scale package system 200 is coupled to the stacking contact 1806 completing the structure.

The package on package structure 1800 can very efficiently couple three or more of the integrated circuits in a space the size of the second integrated circuit 128. This configuration is an example only and it is understood that the stacking substrate 1804 may support more than the third integrated circuit 1802.

Figure 19:
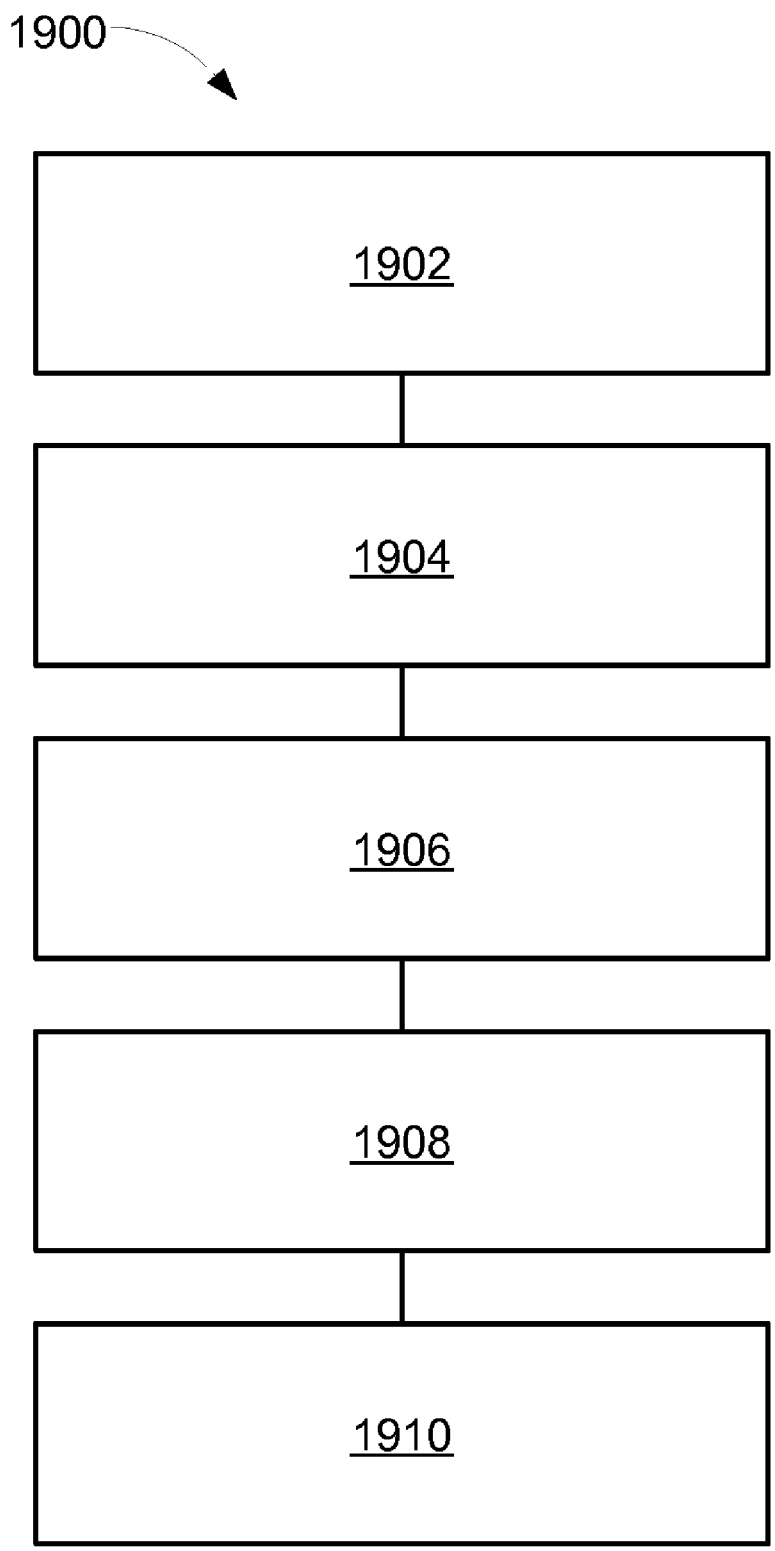
FIG. 19 is a flow chart of a wafer level chip scale package system for manufacturing the wafer level chip scale package system in an embodiment of the present invention.

Referring now to FIG. 19, therein is shown a flow chart of a wafer level chip scale package system 1900 for manufacturing the wafer level chip scale package system 100 in an embodiment of the present invention. The system 1900 includes placing a first integrated circuit on a semiconductor wafer having a second integrated circuit in a block 1902; connecting a second electrical interconnect between the first integrated circuit and the second integrated circuit in a block 1904; forming a stress relieving encapsulant on the outer perimeter of the second integrated circuit for covering the second electrical interconnect in a block 1906; and singulating a chip scale package, from the semiconductor wafer, through the stress relieving encapsulant and the semiconductor wafer in a block 1908.

An aspect of the present invention is that it valuably supports and services the historical trend of reducing costs, simplifying systems, and increasing performance.

These and other valuable aspects of the present invention consequently further the state of the technology to at least the next level.

Thus, it has been discovered that the wafer level chip scale package system of the present invention furnishes important and heretofore unknown and unavailable solutions, capabilities, and functional aspects for multi-chip integrated circuit packaging. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a wafer level chip scale package system comprising:
    forming a base package including:
        forming a package substrate,
        coupling a first integrated circuit to the package substrate, and
        forming a molded cap on the first integrated circuit and the package substrate;
    adhesively bonding the molded cap directly to a semiconductor wafer having a second integrated circuit;
    connecting a second electrical interconnect between the first integrated circuit and the second integrated circuit including directly coupling an active surface of the second integrated circuit and a system side of the package substrate by the second electrical interconnect;
    forming a stress relieving encapsulant on the outer perimeter of the second integrated circuit for covering the second electrical interconnect; and
    singulating a chip scale package, from the semiconductor wafer, through the stress relieving encapsulant and the semiconductor wafer.

2. The method as claimed in claim 1 further comprising forming a second wire bond pad and a contact pad on a system side of the package substrate.

3. The method as claimed in claim 1 further comprising applying a dam material around the semiconductor wafer and over the edge of a base package for forming a reservoir.

4. The method as as claimed in claim 1 further comprising forming a system interconnect on a base package includes connecting electrically the base package, the first integrated circuit, the second integrated circuit, or a combination thereof.

5. The method as claimed in claim 1 further comprising forming a package on package structure comprising:
    forming a stacking substrate having a third integrated circuit electrically coupled thereto;
    forming a first system interconnect between a component side of the stacking substrate and the chip scale package; and
    providing a second system interconnect on the system side of the stacking substrate for connecting electrically a printed circuit board, the first integrated circuit, the second integrated circuit, the third integrated circuit, or a combination thereof.

6. A method for manufacturing a wafer level chip scale package system comprising:
    forming a base package having an first integrated circuit electrically connected to a package substrate including encapsulating the first integrated circuit, a first electrical interconnect, and a component side of the package substrate by a molded cap;
    adhesively bonding the molded cap directly to a semiconductor wafer having a second integrated circuit including applying a pick and place machine for positioning the base package on an active surface of the second integrated circuit;
    connecting a second electrical interconnect electrically between the base package and the second integrated circuit including bonding a bond wire between the active surface of the second integrated circuit and a system side of the package substrate;

forming a stress relieving encapsulant on the outer perimeter of the second integrated circuit for covering the second electrical interconnect includes molding an under-fill material; and singulating a chip scale package from the semiconductor wafer by sawing through the stress relieving encapsulant and the semiconductor wafer.

7. The method as claimed in claim 6 wherein forming the base package includes forming the package substrate having a second wire bond pad and a contact pad on the system side of the package substrate.

8. The method as claimed in claim 6 further comprising applying a dam material around the semiconductor wafer and over the edge of a base package for forming a reservoir including filling the reservoir with the stress relieving encapsulant.

9. The method as claimed in claim 6 further comprising forming a system interconnect on the base package includes connecting electrically the base package, the first integrated circuit, the second integrated circuit, or a combination thereof by attaching a bond wire between the second integrated circuit and the system side of the package substrate.

10. The method as claimed in claim 6 further comprising forming a package on package structure comprising:
   forming a stacking substrate having a third integrated circuit electrically coupled thereto including providing a first contact pad on. the component side and a second contact pad on the system side of the stacking substrate;
   forming a first system interconnect between the component side of the stacking substrate and the chip scale package including forming a solder ball, a solder column, or a stud bump; and
   providing a second system interconnect on the system side of the stacking substrate for connecting electrically a printed circuit board, the first integrated circuit, the second integrated circuit, the third integrated circuit, or a combination thereof.

11. A wafer level chip scale package system comprising:
   a base package including:
      a package substrate,
      a first integrated circuit coupled to the package substrate, and
      a molded cap formed on the first integrated circuit and the package substrate;
   a semiconductor wafer having a second integrated circuit and having the molded cap adhesively bonded directly thereto;
   a second electrical interconnect connected between the first integrated circuit and the second integrated circuit;
   a stress relieving encapsulant formed on the outer perimeter of the second integrated circuit for covering the second electrical interconnect; and
   a chip scale package singulated, from the semiconductor wafer, through the stress relieving encapsulant and the semiconductor wafer; and
   wherein:
      the second electrical interconnect is a bond wire; and
      the stress relieving elcapsulant is an under-fill material, including:
         the bond wire between an active surface of the second integrated circuit and a system side of the package substrate, and
         the under-fill material molded on the outer perimeter of the second integrated circuit over the bond wire.

12. The system as claimed in claim 11 further comprising a second wire bond pad and a contact pad on a system side of the package substrate.

13. The system as claimed in claim 11 further comprising a dam material around the semiconductor wafer and over the edge of a base package for forming a reservoir.

14. The system as claimed in claim 11 further comprising a system interconnect on a base package includes the base package, the first integrated circuit, the second integrated circuit, or a combination thereof connected electrically.

15. The system as claimed in claim 11 further comprising a package on package structure comprising:
   a stacking substrate having a third integrated circuit electrically coupled thereto;
   a first system interconnect between the component side of the stacking substrate and the chip scale package; and
   a second system interconnect on the system side of the stacking substrate for connecting electrically a printed circuit board, the first integrated circuit, the second integrated circuit, the third integrated circuit, or a combination thereof.

16. The system as claimed in claim 11 wherein the molded cap on the first integrated circuit is formed on a first electrical interconnect and a component side of the package substrate.

17. The system as claimed in claim 16 wherein the base package includes the package substrate having a second wire bond pad and a contact pad on the system side of the package substrate.

18. The system as claimed in claim 16 further comprising a dam material around the semiconductor wafer and over the edge of a base package for forming a reservoir including the reservoir filled with the stress relieving encapsulant.

19. The system as claimed in claim 16 further comprising a system interconnect on the base package includes the base package, the first integrated circuit, the second integrated circuit, or a combination thereof connected electrically by a bond wire between the second integrated circuit and the system side of the package substrate.

20. The system as claimed in claim 16 further comprising a package on package structure comprising:
   a stacking substrate having a third integrated circuit electrically coupled thereto, including a first contact pad on the component side and a second contact pad on the system side of the stacking substrate;
   a first system interconnect between the component side of the stacking substrate and the chip scale package includes a solder ball, a solder column, or a stud bump; and
   a second system interconnect on the system side of the stacking substrate for connecting electrically a printed circuit board, the first integrated circuit, the second integrated circuit, the third integrated circuit, or a combination thereof.

* * * * *

UNITED STATES PATENT AND TRADEMARK OFFICE
CERTIFICATE OF CORRECTION

| | | |
|---|---|---|
| PATENT NO. | : 8,012,867 B2 | Page 1 of 1 |
| APPLICATION NO. | : 11/618647 | |
| DATED | : September 6, 2011 | |
| INVENTOR(S) | : Lee et al. | |

It is certified that error appears in the above-identified patent and that said Letters Patent is hereby corrected as shown below:

Column 10:
claim 4, line 37, delete "as as" and insert therefor --as--

Signed and Sealed this
Twenty-fifth Day of September, 2012

David J. Kappos
*Director of the United States Patent and Trademark Office*